(12) United States Patent
Sato

(10) Patent No.: US 9,614,485 B2
(45) Date of Patent: Apr. 4, 2017

(54) AMPLIFIER CIRCUIT

(71) Applicant: FUJITSU LIMITED, Kawasaki-shi, Kanagawa (JP)

(72) Inventor: Masaru Sato, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/571,734

(22) Filed: Dec. 16, 2014

(65) Prior Publication Data

US 2015/0256129 A1    Sep. 10, 2015

(30) Foreign Application Priority Data

Mar. 6, 2014 (JP) ................................ 2014-044010

(51) Int. Cl.
    *H03F 1/02*    (2006.01)
    *H03F 3/16*    (2006.01)
    *H03F 3/60*    (2006.01)
    *H03F 1/56*    (2006.01)

(52) U.S. Cl.
    CPC ............. *H03F 3/605* (2013.01); *H03F 1/56* (2013.01); *H03F 3/607* (2013.01); *H03F 2200/222* (2013.01); *H03F 2200/387* (2013.01); *H03F 2200/451* (2013.01)

(58) Field of Classification Search
    USPC .................. 330/295, 124 R, 84, 286, 53
    See application file for complete search history.

(56) References Cited

U.S. PATENT DOCUMENTS

| 6,472,941 B2* | 10/2002 | Shigematsu | ............ H03F 3/607 330/286 |
| 7,498,883 B2* | 3/2009 | Wu | ......................... H03F 3/602 330/286 |

FOREIGN PATENT DOCUMENTS

JP    5-251962    9/1993

* cited by examiner

*Primary Examiner* — Hieu Nguyen
(74) *Attorney, Agent, or Firm* — Fujitsu Patent Center

(57) ABSTRACT

An amplifier circuit includes: plural transistors; plural first transmission lines respectively connected between input terminals of the plural transistors; plural second transmission lines respectively connected between output terminals of the plural transistors; an input node connected to the input terminal of a first stage transistor among the plural transistors; an output node connected to the output terminal of a final stage transistor among the plural transistors; and a capacitance connected to the output terminal of the first stage transistor via a third transmission line.

9 Claims, 5 Drawing Sheets

US 9,614,485 B2

AMPLIFIER CIRCUIT

CROSS-REFERENCE TO RELATED APPLICATION

This application is based upon and claims the benefit of priority of the prior Japanese Patent Application No. 2014-044010, filed on Mar. 6, 2014, the entire contents of which are incorporated herein by reference.

FIELD

The embodiments discussed herein are directed to an amplifier circuit.

BACKGROUND

According to progress of broadband in recent years, requirement for a large-capacity and high-speed radio communication has been increased. In preparation for enlargement of capacity, a third generation becomes widely used in an amplifier circuit for a base station of mobile phones, and further, it is predicted to proceed to a fourth generation. Besides, a new communication method (LTE) is also practically used, and it is predicted that the enlargement of capacity further advances in future. Accordingly, an amplifier circuit with higher powered, and higher efficiency has been required. On the other hand, for an amplifier circuit for a radar transmission/reception module, high-power and broadbanding are required to enable high-performance such as expansion of sensing distance, resolution enhancement, and so on, and further high-efficiency is required to enable reduction in operation cost and downsizing of a cooler.

An amplifier including an input terminal, an output terminal, a first transmission line connected to the input terminal, and a second transmission line connected to the output terminal is known (for example, refer to Patent Document 1). In a common-source field-effect transistor or a common-emitter transistor, a gate terminal or a base terminal is connected to the first transmission line, and a drain terminal or a collector terminal is connected to the second transmission line. A gate-bias variable field-effect transistor or a base-bias variable transistor is provided at least one of a first terminal at an opposite side of the input terminal of the first transmission line or a second terminal at an opposite side of the output terminal of the second transmission line, and is grounded via a capacitor element.

[Patent Document 1] Japanese Laid-open Patent Publication No. 05-251962

In the amplifier circuit, there is a case when wasteful electric power is consumed if a signal in a wide frequency band is amplified and efficiency deteriorates. However, to improve the efficiency, gain is lowered. It is difficult to enable both high efficiency and high gain.

SUMMARY

An amplifier circuit includes: plural transistors; plural first transmission lines respectively connected between input terminals of the plural transistors; plural second transmission lines respectively connected between output terminals of the plural transistors; an input node connected to the input terminal of a first stage transistor among the plural transistors; an output node connected to the output terminal of a final stage transistor among the plural transistors; and a capacitance connected to the output terminal of the first stage transistor via a third transmission line.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1:
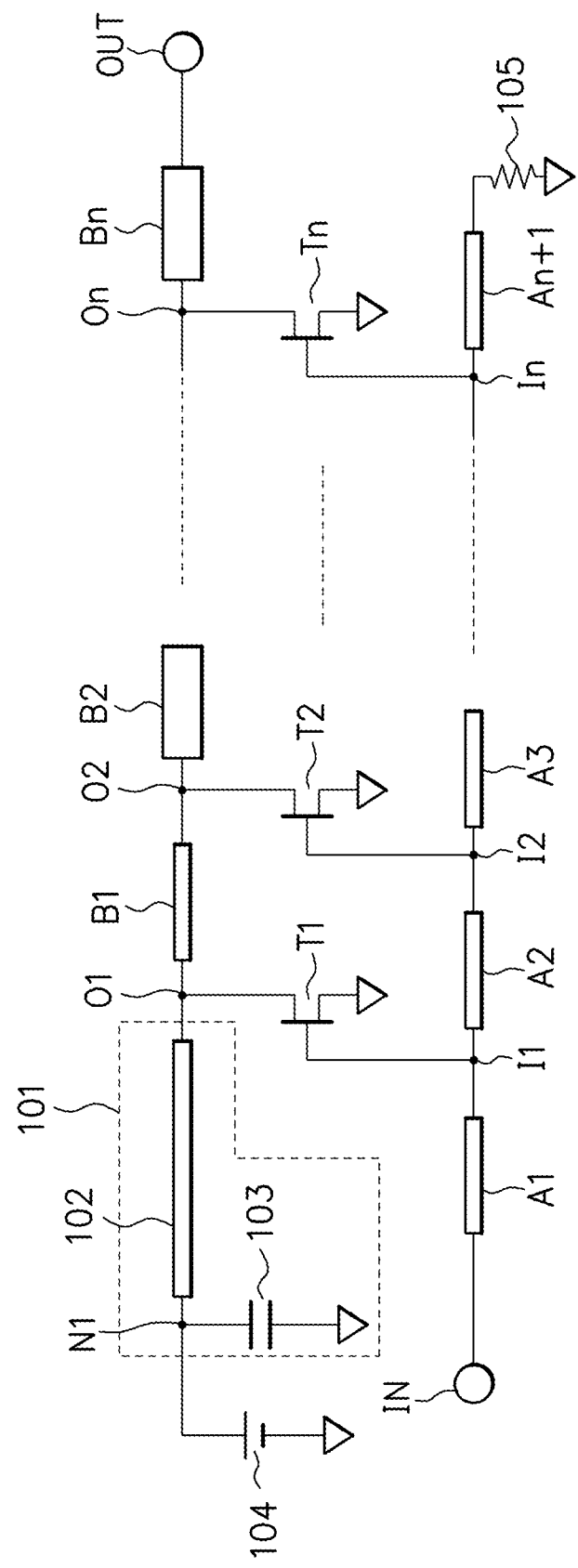
FIG. 1 is a circuit diagram illustrating a configuration example of an amplifier circuit according to a first embodiment.

FIG. 1 is a circuit diagram illustrating a configuration example of an amplifier circuit according to a first embodiment. A source terminal (reference terminal) of each of n-pieces of n-channel field-effect transistors T1 to Tn is connected to a reference potential node (for example, a ground potential node). The field-effect transistor T1 is a first stage transistor among the n-pieces of field-effect transistors T1 to Tn. The field-effect transistor Tn is a final stage transistor among the n-pieces of field-effect transistors T1 to Tn.

Plural first transmission lines A2 to An are respectively connected between gate terminals (input terminals) I1 to In of the plural field-effect transistors T1 to Tn. A first transmission line A1 is connected between an input node IN and the gate terminal I1 of the first stage field-effect transistor T1. The gate terminal In of the final stage field-effect transistor Tn is connected to a terminating resistor 105 via a first transmission line An+1. The terminating resistor 105 is connected between the first transmission line An+1 and the reference potential node. Line lengths of the first transmission lines A1 to An+1 are the same with each other.

Plural second transmission lines B1 to Bn−1 are respectively connected between drain terminals (output terminals) O1 to On of the plural field-effect transistors T1 to Tn. A second transmission line Bn is connected between an output node OUT and the drain terminal On of the final stage field-effect transistor Tn. Line lengths of the second transmission lines B1 to Bn are the same with each other. Each of the line lengths of the second transmission lines B1 to Bn is the same as each of the line lengths of the first transmission lines A1 to An+1.

A short stub 101 includes a third transmission line 102 and a capacitance 103. The third transmission line 102 is connected between the drain terminal O1 of the first stage field-effect transistor T1 and a node N1. The capacitance 103 is connected between the node N1 and the reference potential node. Namely, the capacitance 103 is connected to the drain terminal O1 of the first stage field-effect transistor T1 via the third transmission line 102. A bias power supply 104 is connected between the node N1 and the reference potential node.

The input node IN inputs an AC signal in a predetermined frequency band whose center frequency is, for example, 12 GHz. The field-effect transistors T1 to Tn each amplify signals input to the gate terminals I1 to In, and output the amplified signals to the drain terminals O1 to On. The signals input to the input node IN are distributed to gates of the field-effect transistors T1 to Tn, and remaining electric power of the signals is consumed at the terminating resistor 105. The remaining electric power of the signals is consumed at the terminating resistor 105, and thereby, it is possible to prevent reflection of the signals, and to suppress lowering of gain. Note that the above-stated remaining electric power of the signals is small, and therefore, power loss is small.

Besides, the first transmission lines A1 to An+1 function as an input matching circuit including a parasitic inductor L and a parasitic capacitance C, and it is possible to enable an input impedance matching by setting a characteristic impedance $\sqrt{(L/C)}$ at, for example, 50Ω. Similarly, the second transmission lines B1 to Bn function as an output matching circuit including the parasitic inductor L and the parasitic capacitance C, and it is possible to enable an output impedance matching by setting the characteristic impedance $\sqrt{(L/C)}$ at, for example, 50Ω.

A signal passing through the first stage field-effect transistor T1 reaches the terminal O2 from the input node IN via two transmission lines A1 and B1. Besides, a signal passing through the second stage field-effect transistor T2 reaches the terminal O2 from the input node IN via two transmission lines A1 and A2. The line lengths of the transmission lines where both signals pass through are the same. Accordingly, at the terminal O2, phases of the signal which passes through the field-effect transistor T1 and the signal which passes through the field-effect transistor T2 are the same, so both signals are added, and the signal becomes large. Similarly, at the terminals O2 to On, the phases of the signals passing through the field-effect transistors T1 to Tn are respectively the same, so respective signals are added, and the signals become large.

The signal passing through the first stage field-effect transistor T1 reaches the output node OUT from the input node IN via the n+1 pieces of transmission lines A1 and B1 to Bn. Besides, the signal passing through the second stage field-effect transistor T2 reaches the output node OUT from the input node IN via the n+1 pieces of transmission lines A1, A2 and B2 to Bn. Similarly, the signal passing through the final stage field-effect transistor Tn reaches the output node OUT from the input node IN via the n+1 pieces of transmission lines A1 to An, and Bn. The line lengths of the transmission lines where signals pass are the same as for the signals of all of the field-effect transistors T1 to Tn. Accordingly, the phases of the signals passing through all of the field-effect transistors T1 to Tn become the same at the output node OUT, so these signals are added, and the signal becomes large. The amplifier circuit is able to amplify the signals input to the input node IN by the n-pieces of field-effect transistors T1 to Tn, add the amplified signals, and output from the output node OUT. The amplifier circuit is thereby able to amplify signals in wide frequency band.

Line widths of the second transmission lines B1 to Bn become wide as they are near the output node OUT. The line width of the transmission line B2 is wider than that of the transmission line B1. The line width of the transmission line B3 is wider than that of the transmission line B2. Similarly, the line width of the transmission line Bn is wider than that of the transmission line Bn−1. An output signal of the field-effect transistor T2 branches into right and left at the terminal O2. The line width of the transmission line B2 at the right of the terminal O2 is wider than that of the transmission line B1 at the left of the terminal O2, and a resistance is small. Accordingly, most of electric power of the output signal of the field-effect transistor T2 branches into the right transmission line B2 at the terminal O2. Similarly, at the terminals O3 to On, most of the electric power of each of output signals of the field-effect transistors T3 to Tn branches into right transmission lines B3 to Bn. At each of the terminals O2 to On, most of the electric power branches toward the output node OUT, and therefore, efficiency improves.

The signals slightly branch into the left transmission lines at the terminals O1 to On are positively reflected by the short stub 101 to return a reflected wave to the terminal O1. If the reflected wave is the same phase as the output signals of the transistors T1 to Tn, it is possible to enhance the signal and to improve the gain. On the other hand, if the reflected wave is an opposite phase from the output signals of the transistors T1 to Tn, the signal is weakened, and the gain is lowered. Therefore, a line length of the third transmission line 102 is set such that the reflected wave becomes the same phase as the output signals of the transistors T1 to Tn. The reflected wave thereby becomes the same phase as the output signals of the transistors T1 to Tn, and therefore, it is possible to improve the gain.

Note that a method providing a terminating resistor instead of the short stub 101 is conceivable. In this case, it is possible to prevent the reflection of the signals branched into the left transmission lines at the terminals O1 to On, but the electric power of the branched signals is wastefully consumed at the terminating resistor, and therefore, efficiency is lowered.

Besides, when the short stub 101 does not exist, the signals branched into the left transmission lines at the terminals O1 to On reflect, negate with each other, and the gain is lowered at a predetermined frequency band.

Figure 2:
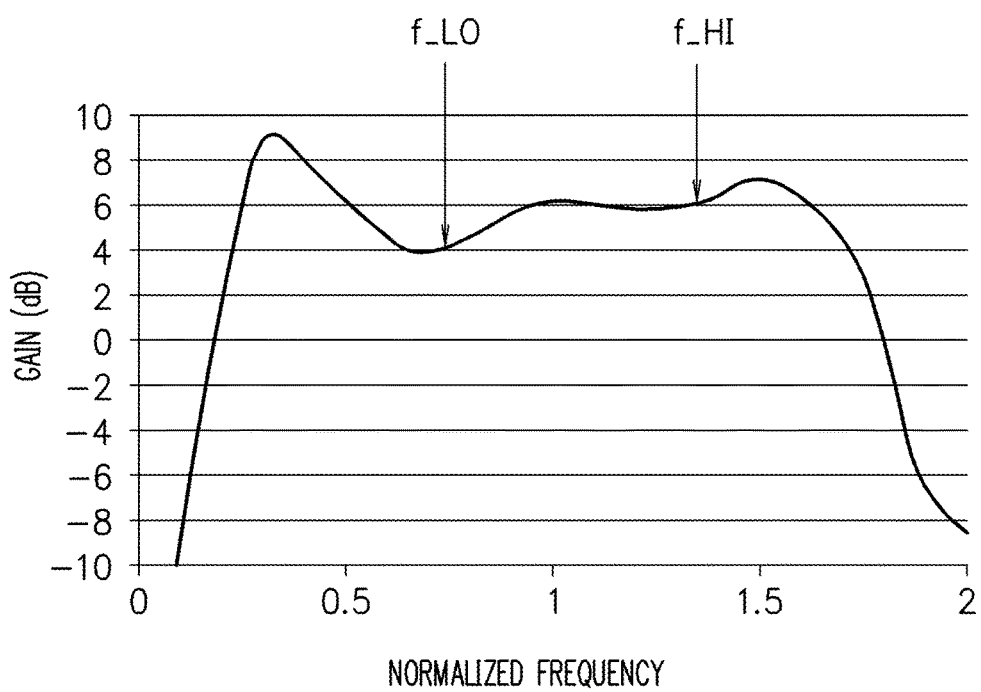
FIG. 2 is a view illustrating a simulation result of the amplifier circuit when a short stub does not exist in FIG. 1.

FIG. 2 is a view illustrating a simulation result of the amplifier circuit when the short stub 101 does not exist in FIG. 1. The "n" in FIG. 1 is "5". Namely, five pieces of field-effect transistors T1 to T5 are used. A vertical axis represents the gain. A horizontal axis represents a normalized frequency of the input signal of the input node IN. The "1" of the normalized frequency is 12 GHz. For example, a signal in a frequency band from a lower limit frequency f_LO to an upper limit frequency f_HI centering on a center frequency is used. It can be seen that the gain is lowered in a vicinity of the lower limit frequency f_LO. A lowering amount of the gain at the frequency in the vicinity of the lower limit frequency f_LO is 2 dB compared to the gain at the center frequency. As stated above, the gain is lowered at a low frequency side.

Figure 3:
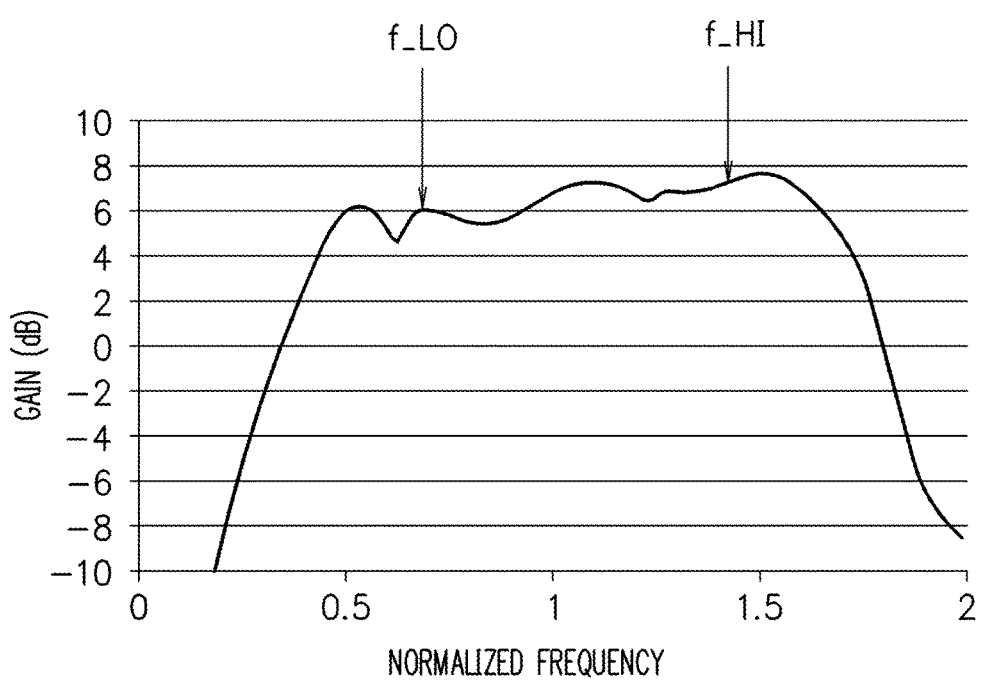
FIG. 3 is a view illustrating a simulation result of the amplifier circuit in FIG. 1 when the short stub according to the first embodiment exists.

FIG. 3 is a view illustrating a simulation result of the amplifier circuit in FIG. 1 having the short stub 101 according to the first embodiment. Hereinafter, points in which FIG. 3 is different from FIG. 2 are described. The line length of the third transmission line 102 is 0.127 times relative to a wavelength at the center frequency of the input signal. According to the present embodiment, the gain in the vicinity of the lower limit frequency f_LO improves compared to FIG. 2, and it is possible to obtain approximately constant high gain from the lower limit frequency f_LO to the upper limit frequency f_HI.

Figure 4:
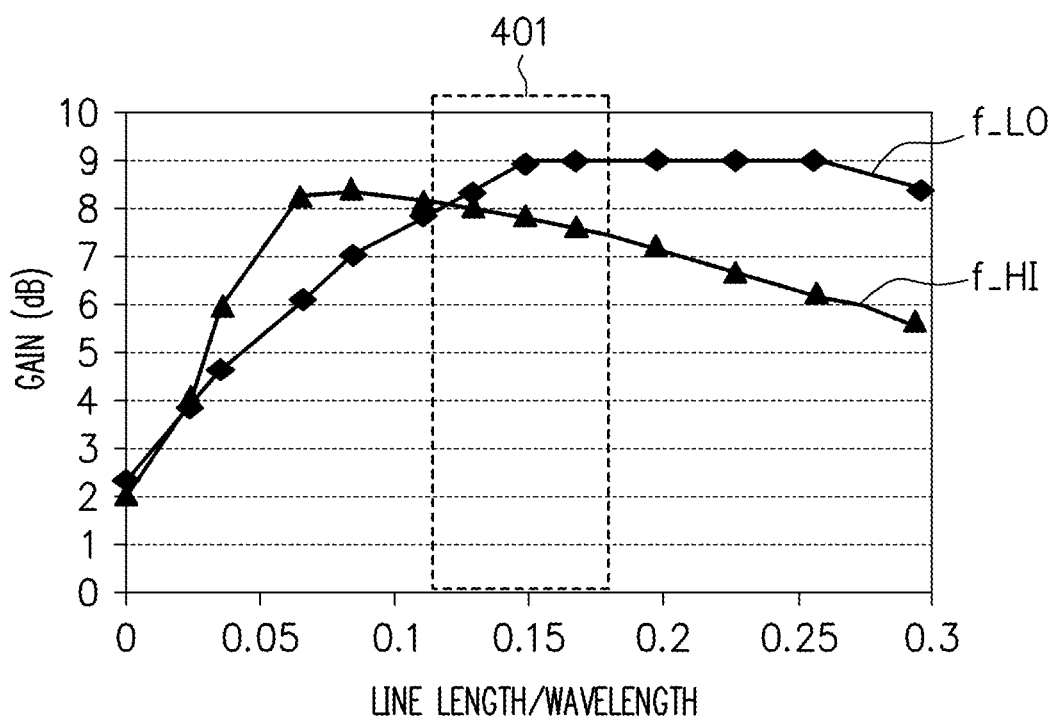
FIG. 4 is a view illustrating a simulation result of gain relative to a line length of a third transmission line.

FIG. 4 is a view illustrating a simulation result of the gain relative to the line length of the third transmission line 102. A vertical axis represents the gain. A horizontal axis is a ratio of the line length of the third transmission line 102 relative to the wavelength at the center frequency of the input signal of the input node IN. It can be seen that the gain at the lower limit frequency f_LO and the gain at the upper limit frequency f_HI are both high gains within a range 401 in which the ratio of the line length in the horizontal axis is 0.11 or more and 0.18 or less. Accordingly, it is preferable that the line length of the third transmission line 102 is 0.11 times or more and 0.18 times or less of the wavelength at the center frequency of the signal input to the input node IN. In this case, it is possible to obtain the high gain at both the lower limit frequency f_LO and the upper limit frequency f_HI.

Note that in the present embodiment, the phase of the reflected wave is adjusted by the short stub 101, and it is synthesized to enhance the signal by the reflected wave, and therefore, all of the line widths of the second transmission lines B1 to Bn may be made to be the same. Besides, the short stub 101 is provided, and thereby, it becomes possible to supply a direct current bias current to the field-effect transistors T1 to Tn by the bias power supply 104. Besides, the transmission lines A1 and Bn are able to be removed. The amplifier circuit is able to be used as, for example, an amplifier circuit for a base station of mobile phones, an amplifier circuit for a radar transmission/reception module, or the like.

Second Embodiment

Figure 5:
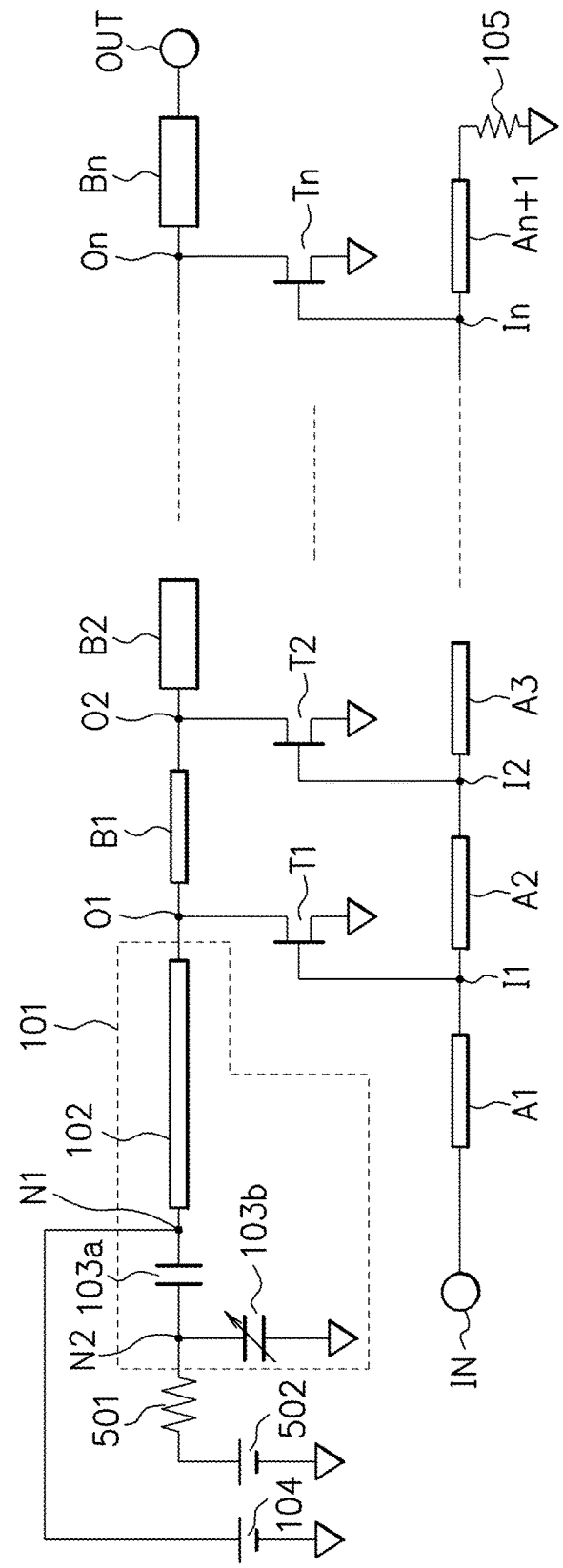
FIG. 5 is a circuit diagram illustrating a configuration example of an amplifier circuit according to a second embodiment.

FIG. 5 is a circuit diagram illustrating a configuration example of an amplifier circuit according to a second embodiment. The present embodiment (FIG. 5) is one in which a capacitance 103a, a varactor diode (variable capacitance) 103b, a resistance 501, and a direct current power supply 502 are provided instead of the capacitance 103 for the first embodiment (FIG. 1). Hereinafter, points in which the present embodiment is different from the first embodiment are described. The short stub 101 includes the third transmission line 102, the capacitance 103a, and the varactor diode 103b. The third transmission line 102 is connected between the terminal O1 and the node N1. The capacitance 103a is connected between the node N1 and a node N2. The varactor diode 103b is connected between the node N2 and the reference potential node. The direct current power supply 502 is connected to the node N2 via the resistance 501. The direct current power supply 502 is connected between the resistance 501 and the reference potential node. The direct current power supply 502 applies a direct current voltage to the varactor diode 103b. The varactor diode 103b is a variable capacitance whose capacitance value changes in accordance with an applied voltage by the external direct current power supply 502. The capacitance 103a and the varactor diode (variable capacitance) 103b correspond to the capacitance 103 in FIG. 1. The capacitance value of the varactor diode (variable capacitance) 103b is changed by the direct current power supply 502, and thereby, the phase of the reflected wave is changed, and it is possible to change the frequency capable of obtaining high gain. Namely, when the frequency of the input signal is changed to be used, it is possible to obtain the high gain at various frequencies by changing the capacitance value of the varactor diode (variable capacitance) 103b by the direct current power supply 502.

Third Embodiment

Figure 6:
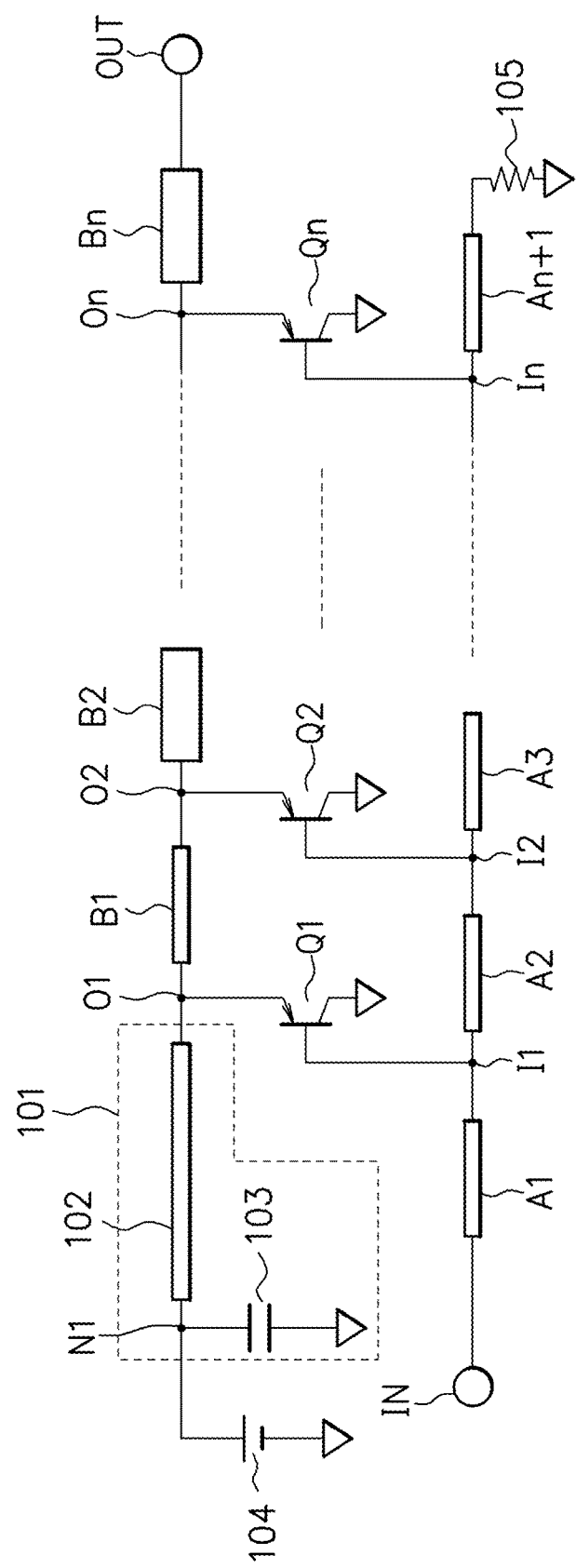
FIG. 6 is a circuit diagram illustrating a configuration example of an amplifier circuit according to a third embodiment.

FIG. 6 is a circuit diagram illustrating a configuration example of an amplifier circuit according to a third embodiment. The present embodiment (FIG. 6) is one in which pnp bipolar transistors Q1 to Qn are provided instead of the n-channel field-effect transistors T1 to Tn for the first embodiment (FIG. 1). Hereinafter, points in which the present embodiment is different from the first embodiment are described. In the n-pieces of pnp bipolar transistors Q1 to Qn, each of collector terminals (reference terminals) is connected to the reference potential node, base terminals (input terminals) are respectively connected to the terminals I1 to In, emitter terminals (output terminals) are respectively connected to the terminals O1 to On. The present embodiment is also able to obtain the similar effects as the first embodiment. Similarly, it is also possible to provide the pnp bipolar transistors Q1 to Qn instead of the re-channel field-effect transistors T1 to Tn in the second embodiment (FIG. 5).

Incidentally, the above-described embodiments are to be considered in all respects as illustrative and no restrictive. Namely, the present invention may be embodied in other specific forms without departing from the spirit or essential characteristics thereof.

A third transmission line and a capacitance are provided, and thereby it is possible to suppress consumption of wasteful electric power, to adjust a phase of a reflected wave, and to improve gain.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An amplifier circuit comprising:
   plural transistors;
   plural first transmission lines respectively configured to be connected between input terminals of the plural transistors;
   plural second transmission lines respectively configured to be connected between output terminals of the plural transistors;
   an input node configured to be connected to the input terminal of a first stage transistor among the plural transistors;
   an output node configured to be connected to the output terminal of a final stage transistor among the plural transistors; and
   a capacitance configured to be connected to the output terminal of the first stage transistor via a third transmission line not passed through a terminating resistor,
   wherein the third transmission line has a line length such that output signals of the plural transistors and a reflected wave become same phase.

2. The amplifier circuit according to claim 1,
wherein a line length of the third transmission line is 0.11 times or more and 0.18 times or less of a wavelength at a center frequency of a signal input to the input node.

3. The amplifier circuit according to claim 1,
wherein a reference terminal of each of the plural transistors is connected to a reference potential node, and
the capacitance is connected between the third transmission line and the reference potential node.

4. The amplifier circuit according to claim 1,
wherein the transistor is an n-channel field-effect transistor,
the input terminal of the transistor is a gate terminal of the n-channel field-effect transistor, and
the output terminal of the transistor is a drain terminal of the n-channel field-effect transistor.

5. The amplifier circuit according to claim 1,
wherein the transistor is a pnp bipolar transistor,
the input terminal of the transistor is a base terminal of the pnp bipolar transistor, and
the output terminal of the transistor is an emitter terminal of the pnp bipolar transistor.

6. The amplifier circuit according to claim 1,
wherein the capacitance is a variable capacitance.

7. The amplifier circuit according to claim 1, further comprising:
a terminating resistor configured to be connected to the input terminal of the final stage transistor.

8. The amplifier circuit according to claim 1, further comprising:
a bias power supply configured to be connected to the output terminal of the first stage transistor via the third transmission line.

9. The amplifier circuit according to claim 1,
wherein line widths of the plural second transmission lines become wider as they are near the output node.

* * * * *